United States Patent [19]
Hsu

[11] Patent Number: 5,650,917
[45] Date of Patent: Jul. 22, 1997

[54] CPU CARD MOUNTING STRUCTURE

[76] Inventor: Fu-Yu Hsu, No. 44-1, Potu Tayuan Hsiang, Tao-Yuan Hsien, Taiwan

[21] Appl. No.: 731,047

[22] Filed: Oct. 9, 1996

[51] Int. Cl.⁶ ..................................................... H05K 7/14
[52] U.S. Cl. ........................... 361/759; 361/756; 361/747; 361/740; 361/727; 439/327
[58] Field of Search ............................... 361/683, 684, 361/685, 686, 714, 715, 726, 732, 727, 759, 760, 801, 802, 803, 736, 737, 740, 741, 747–748, 756; 439/327, 359, 372, 347, 325, 62

[56] References Cited

U.S. PATENT DOCUMENTS

| | | | |
|---|---|---|---|
| 3,905,665 | 9/1975 | Lynch et al. | 439/62 |
| 5,155,663 | 10/1992 | Harase | 361/684 |
| 5,427,534 | 6/1995 | Spickler et al. | 439/325 |
| 5,517,387 | 5/1996 | Smith | 361/686 |

*Primary Examiner*—Leo P. Picard
*Assistant Examiner*—Anthony Dinkins
*Attorney, Agent, or Firm*—Morton J. Rosenberg; David I. Klein

[57] ABSTRACT

A CPU card mounting structure including an electrical connector installed in a mother board and having a card slot, a substantially U-shaped mounting frame mounted on the electrical connector, the U-shaped mounting frame having a horizontal section defining a connector slot, which receives the electrical connector, and two vertical sections raised from two opposite ends of the horizontal section at right angles, each vertical section having a longitudinal sliding groove and a top screw hole, a CPU card inserted through the longitudinal sliding grooves of the vertical sections of the said U-shaped mounting frame into the card slot of the electrical connector to be electrically connected to the mother board, and two holding down devices respectively fastened to the top screw holes of the vertical sections of the U-shaped mounting frame to hold down the CPU card in the card slot of the electrical connector.

6 Claims, 13 Drawing Sheets

CPU CARD MOUNTING STRUCTURE

BACKGROUND OF THE INVENTION

The present invention relates to CPU card mounting structure adapted for mounting a CPU card to a mother board in a vertical position, and relates more particularly to such a CPU card mounting structure which permits the CPU card to be quickly and replaceably installed.

In regular computer mother boards, CPUs are commonly installed in a horizontal position. This mounting method occupies much mother board space. In order to minimize installation space, CPU may be mounted on a card adapted for mounting in a mother board in a vertical position. However, when designing a CPU card for mounting in a mother board in a vertical position, the factors of the stability of the installation of the CPU card and the convenience of its repair and maintenance work must be taken into account.

SUMMARY OF THE INVENTION

The present invention has been accomplished under the circumstances in view. It is one object of the present invention to provide a CPU card mounting structure which permits a CPU card to be installed in a mother board in a vertical position without occupying much mother board space. It is another object of the present invention to provide a CPU card mounting structure which firmly holds down the CPU card in vertical connection to the mother board. According to one aspect of the present invention, the CPU card mounting structure comprises an electrical connector installed in a mother board and having a card slot, a substantially U-shaped mounting frame mounted on the electrical connector, the U-shaped mounting frame having a horizontal section defining a connector slot, which receives the electrical connector, and two vertical sections raised from two opposite ends of the horizontal section at right angles, each vertical section having a longitudinal sliding groove and a top screw hole, a CPU card, which is a circuit board having a CPU mounted thereon, inserted through the longitudinal sliding grooves of the vertical sections of the said U-shaped mounting frame into the card slot of the electrical connector to be electrically connected to the mother board, and two holding down devices respectively fastened to the top screw holes of the vertical sections of the U-shaped mounting frame to hold down the CPU card in the card slot of the electrical connector. Because the CPU card is supported on the U-shaped mounting frame and held down by the holding down devices, it is firmly retained in position. Because the CPU card, the U-shaped mounting frame, and the electrical connector are separately manufactured, they can be separately packed for storage and delivery, and computer distributors can install the CPU card conveniently at their shops. According to another aspect of the present invention, the holding down devices can be made in the form of a screw bolt having an edge-notched head. When the notch of the head of the screw bolt is moved into alignment with the longitudinal sliding groove of the respective vertical section of the U-frame through a rotary motion, the CPU card is allowed to be inserted into the electrical connector or moved out of the U-shaped mounting frame. Alternatively, the holding down device can be an edge-notched nut threaded onto an upright screw rod at the top of one vertical section of the U-shaped mounting frame and forced into engagement with one top edge notch of the CPU card to hold down the CPU card in position.

DETAILED DESCRIPTION OF THE PREFERRED EMBODIMENT

Figure 1:
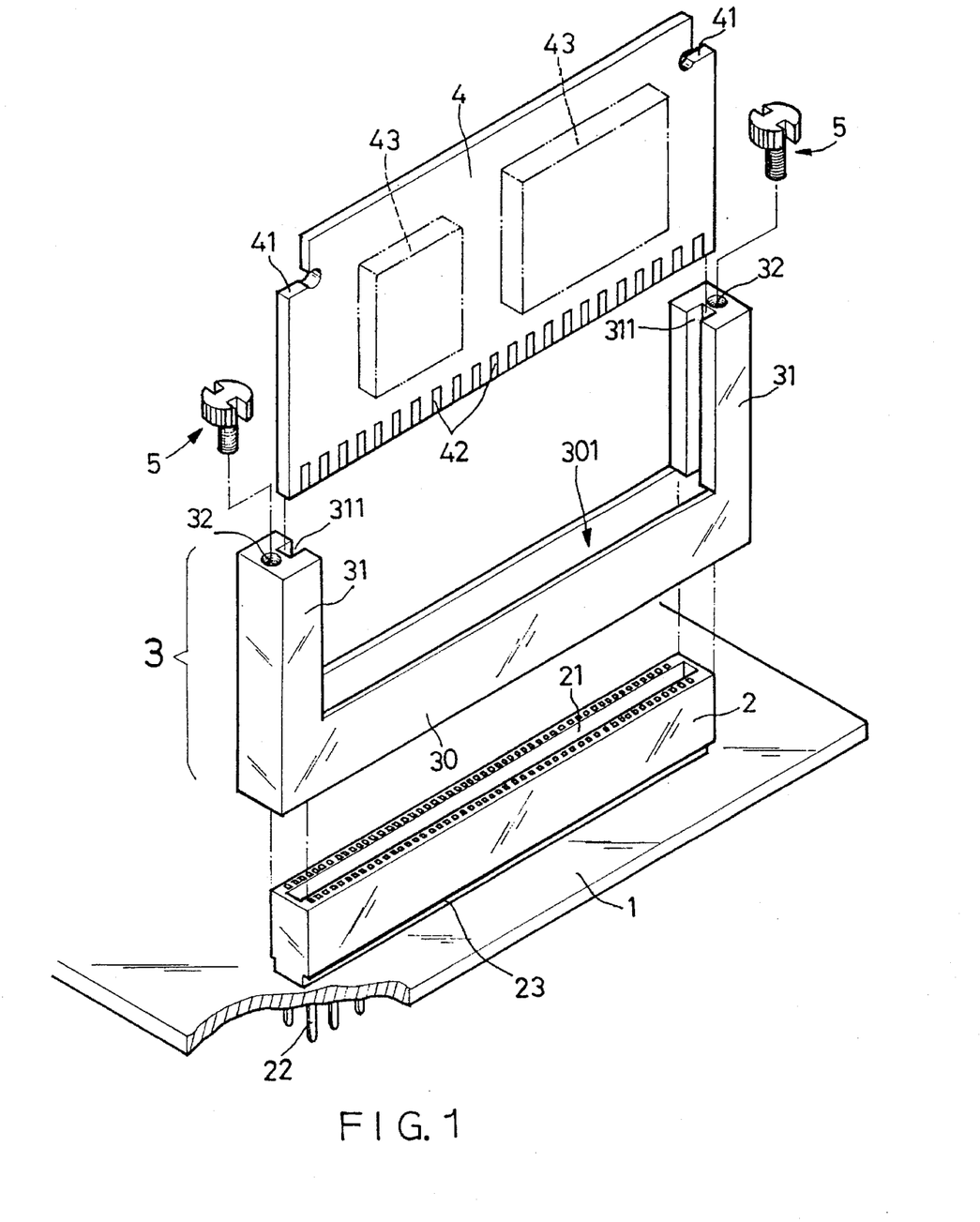
FIG. 1 is an exploded view of a CPU card mounting structure according to the present invention.

Referring to FIG. 1, a CPU card mounting structure in accordance with the present invention is generally comprised of an electric connector 2 connected to a mother board 1, a substantially U-shaped mounting frame 3, a CPU card 4, and two holding down devices 5. The mounting frame 3 comprises a horizontal section 30, and two vertical sections 31 respectively upwardly raised from two opposite ends of the horizontal section 30 at right angles. The horizontal section 30 defines a connector slot 301, which receives the electrical connector 2, permitting the card slot 21 of the electrical connector 2 to be exposed to the outside for the insertion of the CPU card 4. Each of the vertical sections 31 comprises a longitudinal sliding groove 311 at an inner side, and a top screw hole 32 disposed at the top and in parallel to the longitudinal sliding groove 311 into which one holding down device 5 is fastened to secure the CPU card 4 in position. The electrical connector 2 has a plurality of contact pins 22 at the bottom respectively inserted into respective contact holes (not shown) in the mother board 1.

Figure 2:
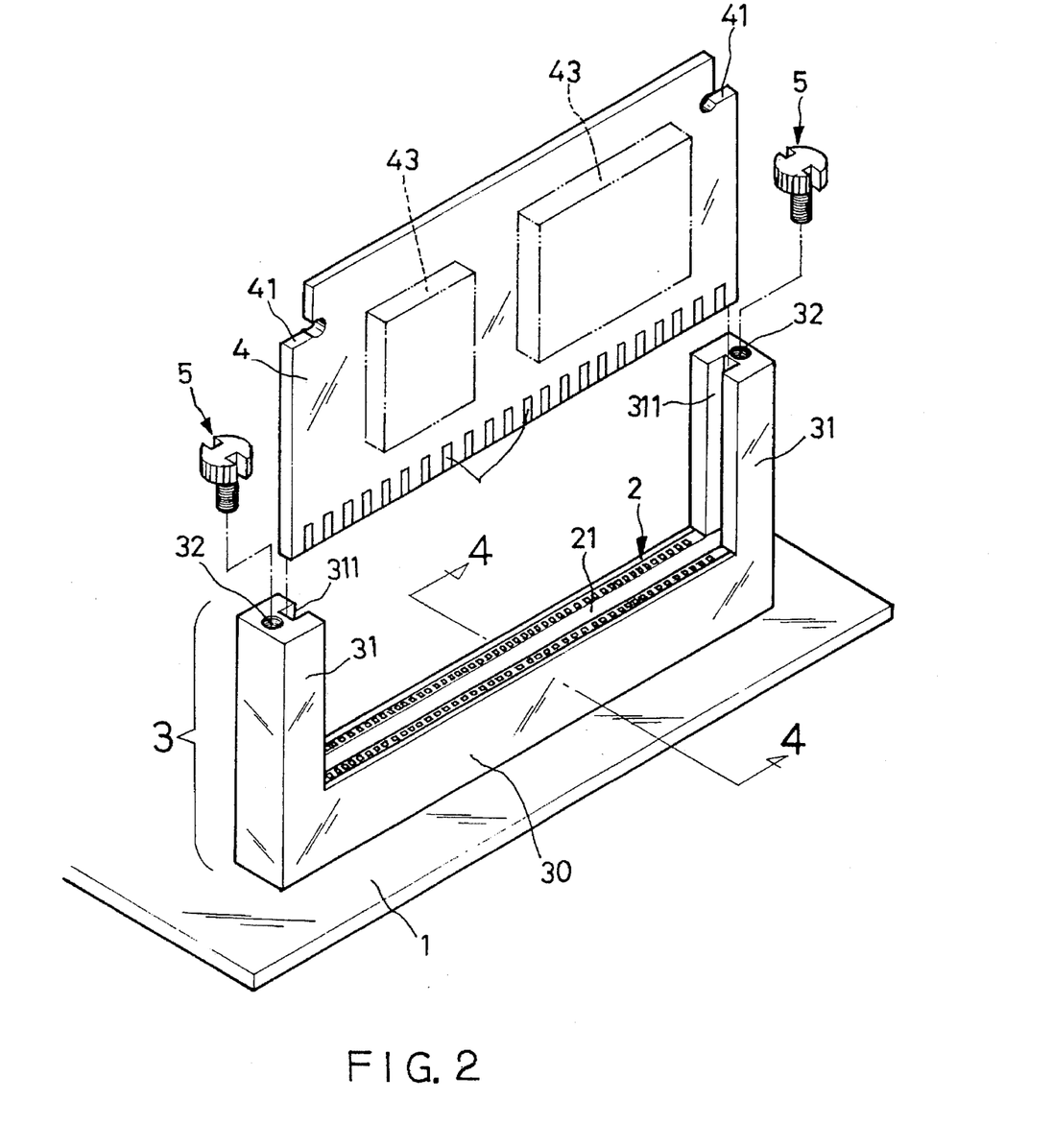
FIG. 2 is similar to FIG. 1 but showing the U-shaped mounting frame fastened to the electrical connector.

Referring to FIG. 2, the U-shaped mounting frame 3 is vertically mounted on the electrical connector 2. When the U-shaped mounting frame 3 is installed, the longitudinal sliding grooves 311 of the vertical sections 31 of the U-shaped mounting frame 3 are respectively connected to the two opposite ends of the card slot 21 of the electrical connector 2 at right angles for guiding the CPU card 4 into the card slot 21. Thus, the CPU card 4 can be inserted through the longitudinal sliding grooves 311 of the vertical sections 31 of the U-shaped mounting frame 3 into the card slot 21 of the electrical connector 2, permitting the bottom contacts 42 thereof to be forced into contact with respective terminals 211 in the electrical connector 2 (see also FIG. 4), and therefore the CPU(s) 43 of the CPU card 4 is (are) electrically connected to the mother board 1 through the electrical connector 2. Further, the CPU card 4 has two edge notches 41 bilaterally disposed at the top for receiving a downward pressure from the holding down devices 5.

Figure 3:
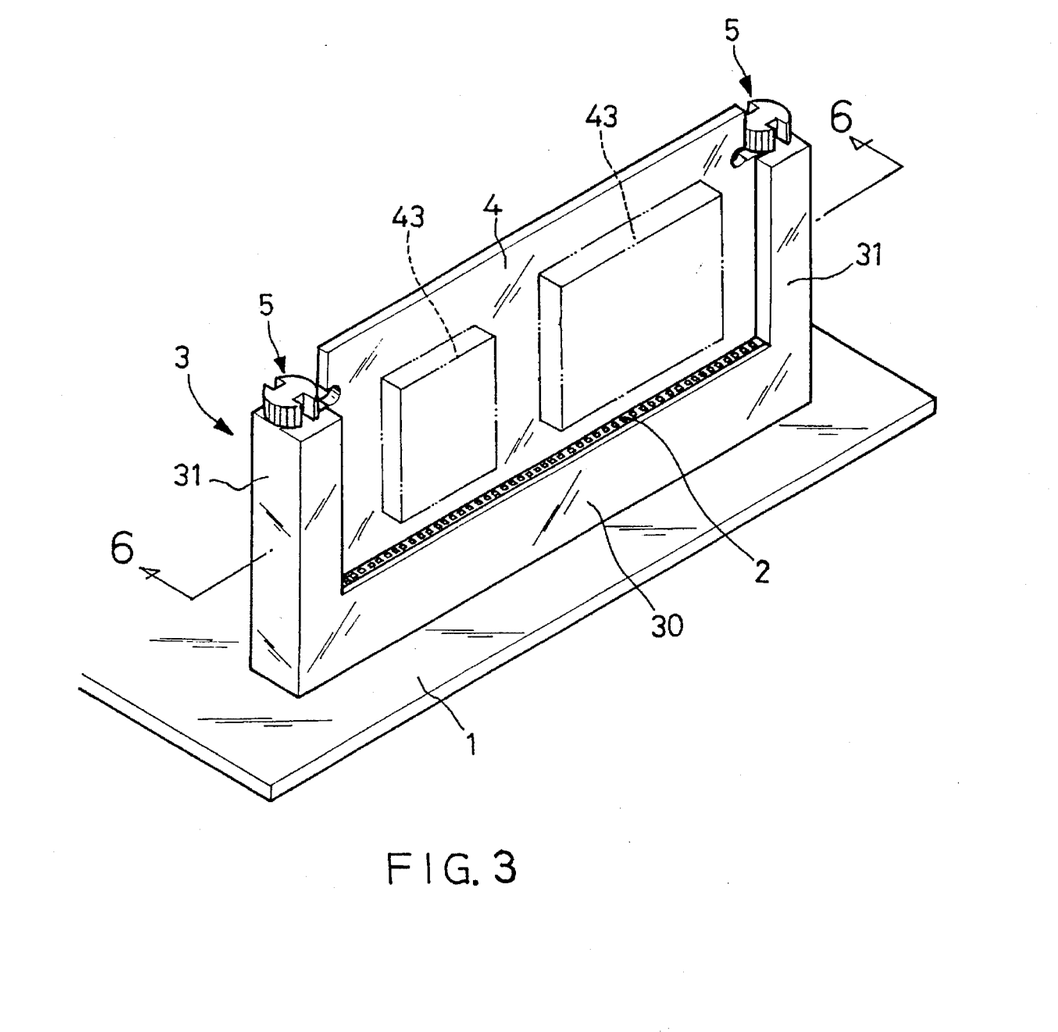
FIG. 3 is a perspective elevational view of the present invention when installed.

FIG. 3 shows the electrical connector 2 fastened to the mother board 1, the mounting frame 3 fastened to the electrical connector 2, and the CPU card 4 installed in the mounting frame 3 and connected to the electrical connector 2. Because the CPU card 4 is mounted within the mounting frame 3, it is firmly maintained connected to the electrical connector 2, and held down in position by the holding down devices 5.

Figures 4, 4A:
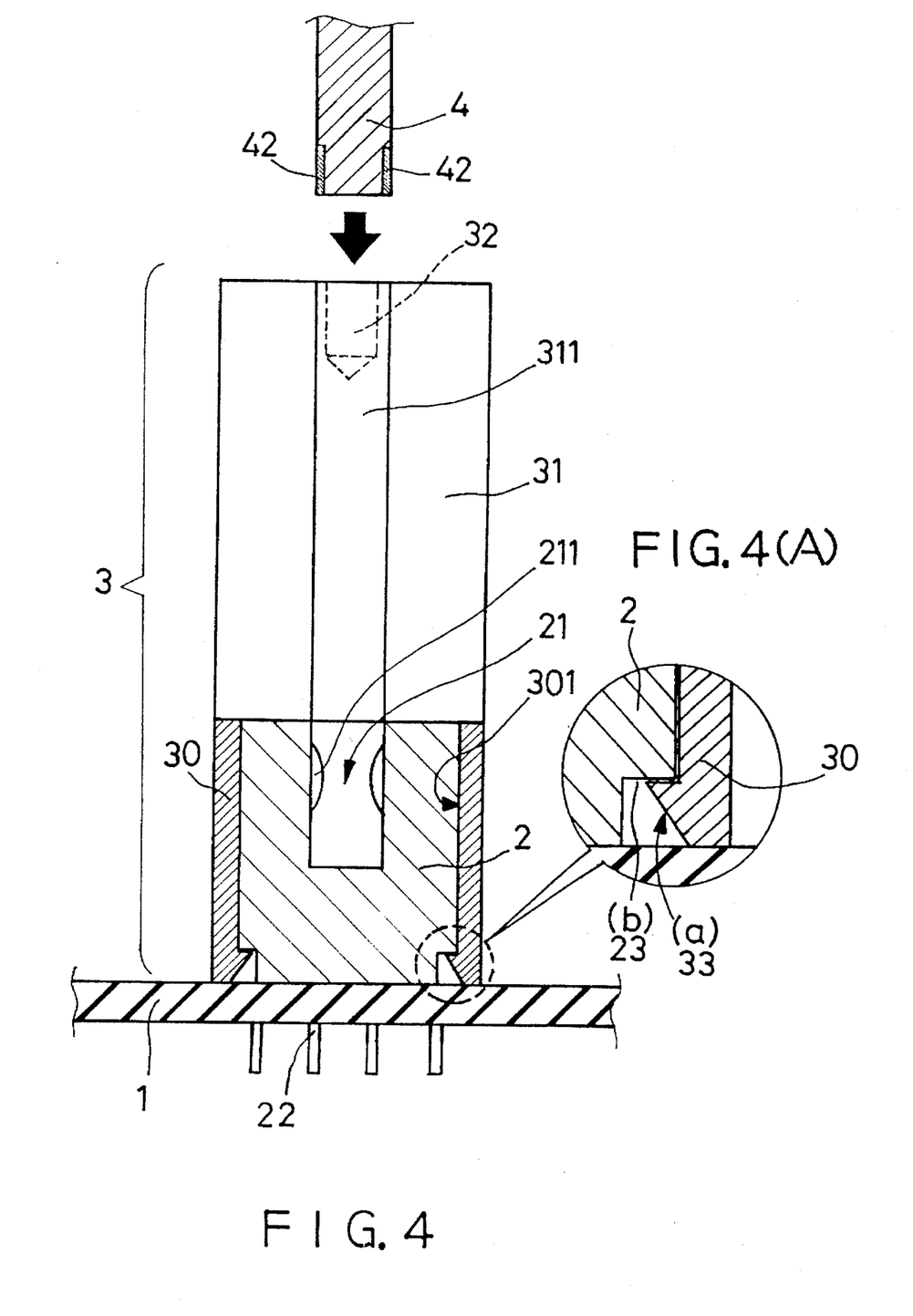
FIG. 4 is a sectional view taken along line 4—4 of FIG. 2.
FIG. 4A is an enlarged view of a part of FIG. 4, showing the engagement between one inward hook of the mounting frame and one retaining groove of the electrical connector.

Referring to FIGS. 4 and 4A, the electrical connector 2 and the mounting frame 3 have a respective coupling device 23 or 33 adapted for coupling to each other. According to the embodiment shown in FIGS. 4 and 4A, the coupling device 23 of the electrical connector 2 comprises at least two retaining grooves 23 bilaterally disposed at the bottom; the coupling device 33 of the mounting frame 3 comprises at least two inward hooks 33 bilaterally disposed on the inside at the bottom. When the mounting frame 3 is mounted on the electrical connector 2, the inward hooks 33 of the mounting frame 3 are forced into engagement with the retaining grooves 23 of the electrical connector 2, and therefore the mounting frame 3 and the electrical connector 2 are firmly retained together.

Figure 5:
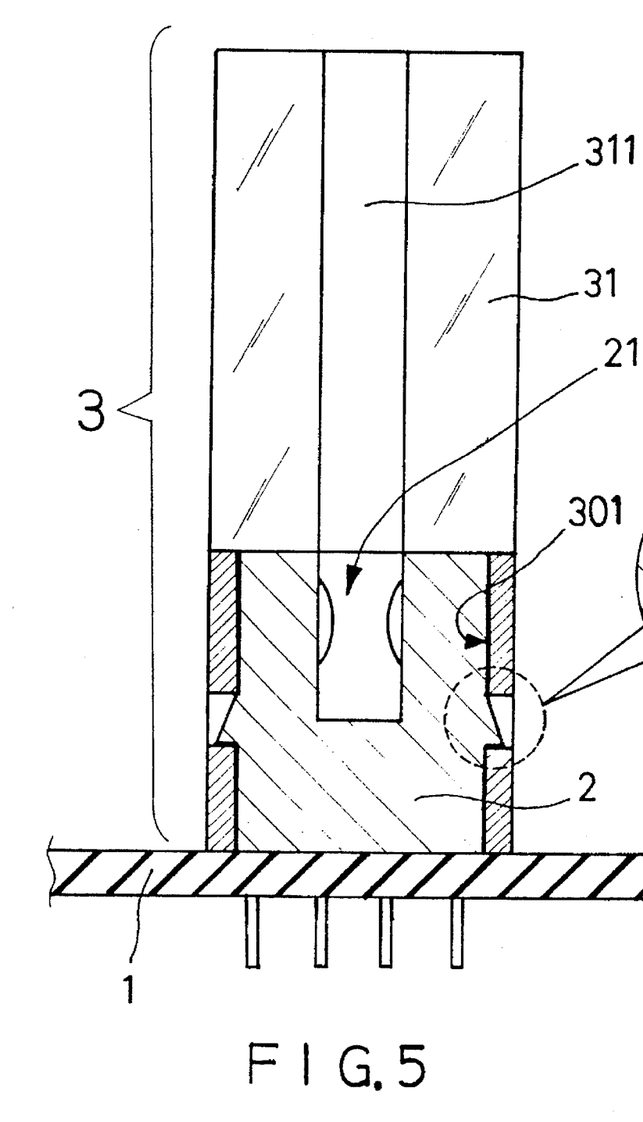
FIG. 5 is a sectional view of an alternate form of the present invention, showing the engagement between the coupling device of the mounting frame and the coupling device of the electrical connector.
Figure 5A:
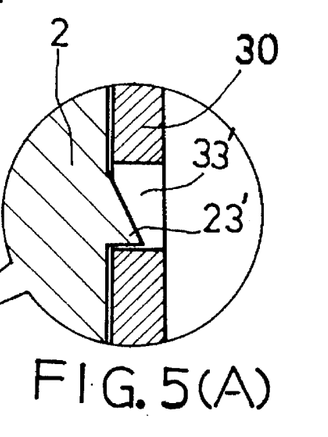
FIG. 5A is an enlarged view of a part of FIG. 5, showing the engagement between one projection of the electrical connector and one retaining groove of the mounting frame.

Referring to FIG. 5, as an alternate form of the present invention, the coupling means of the electrical connector 2 comprises at least two projections of triangular cross section 23' raised from two opposite sides in the middle; the coupling means of the mounting frame 3 comprises at least two retaining grooves 33' bilaterally disposed on the inside in the middle and adapted for engaging the projections 23' of the electrical connector 2.

Figure 6:
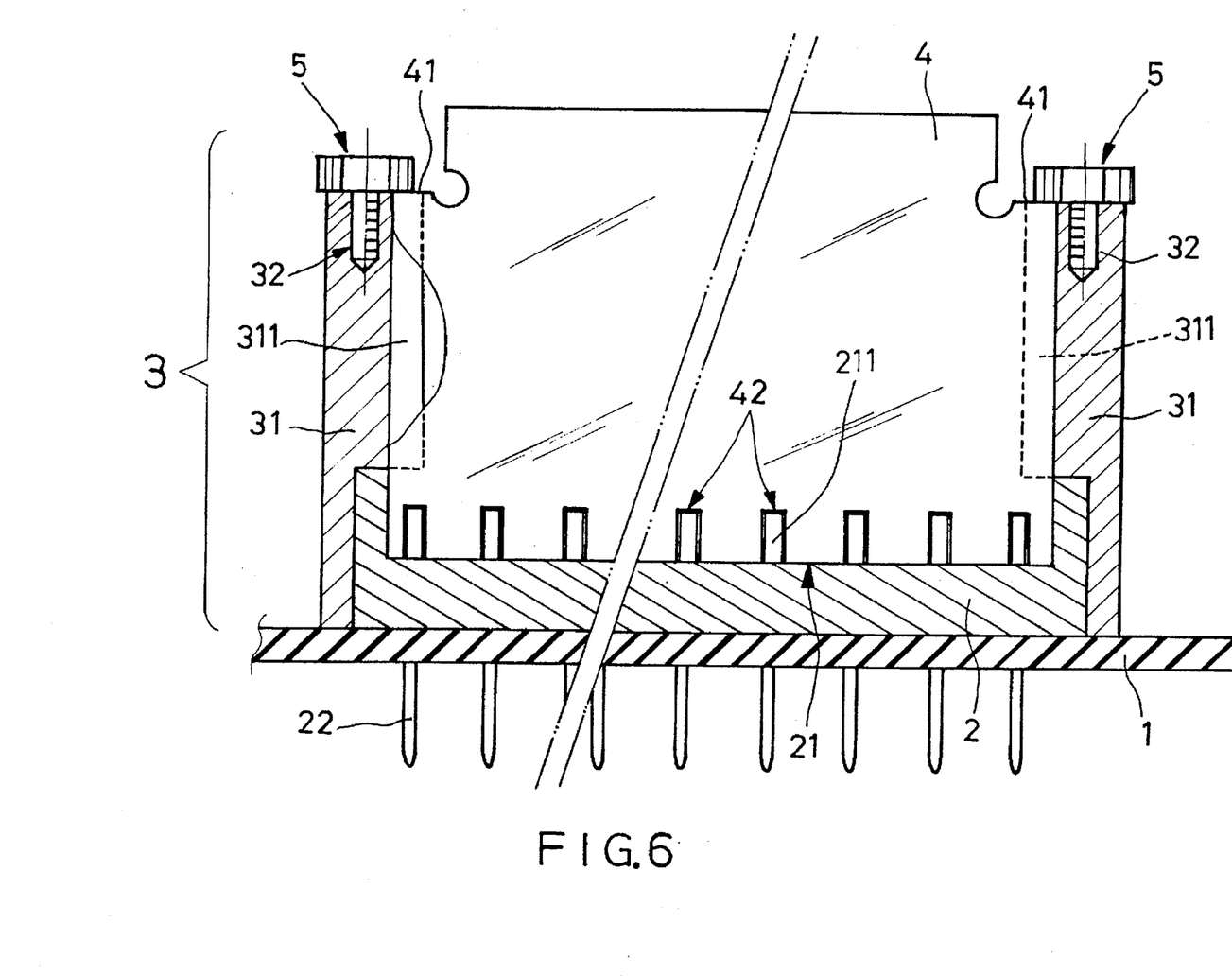
FIG. 6 is a sectional view taken along line 6—6 of FIG. 3.

FIG. 6 is a sectional view taken along line 6—6 of FIG. 3. As illustrated, the CPU card 4 has two opposite lateral sides retained in the longitudinal sliding grooves 311 of the mounting frame 3, and a bottom side retained in the card slot 21 of the electrical connector 2; the contacts 42 of the CPU card 4 are maintained in contact with the terminals 211 inside the card slot 21 of the electrical connector 2; the holding down devices 5 are fastened to the top screw holes 32 of the vertical sections 31 of the mounting frame 3 and engaged with the edge notches 41 of the CPU card 4 to hold down the CPU card 4 in the mounting frame 3 and the electrical connector 2.

Figure 7:
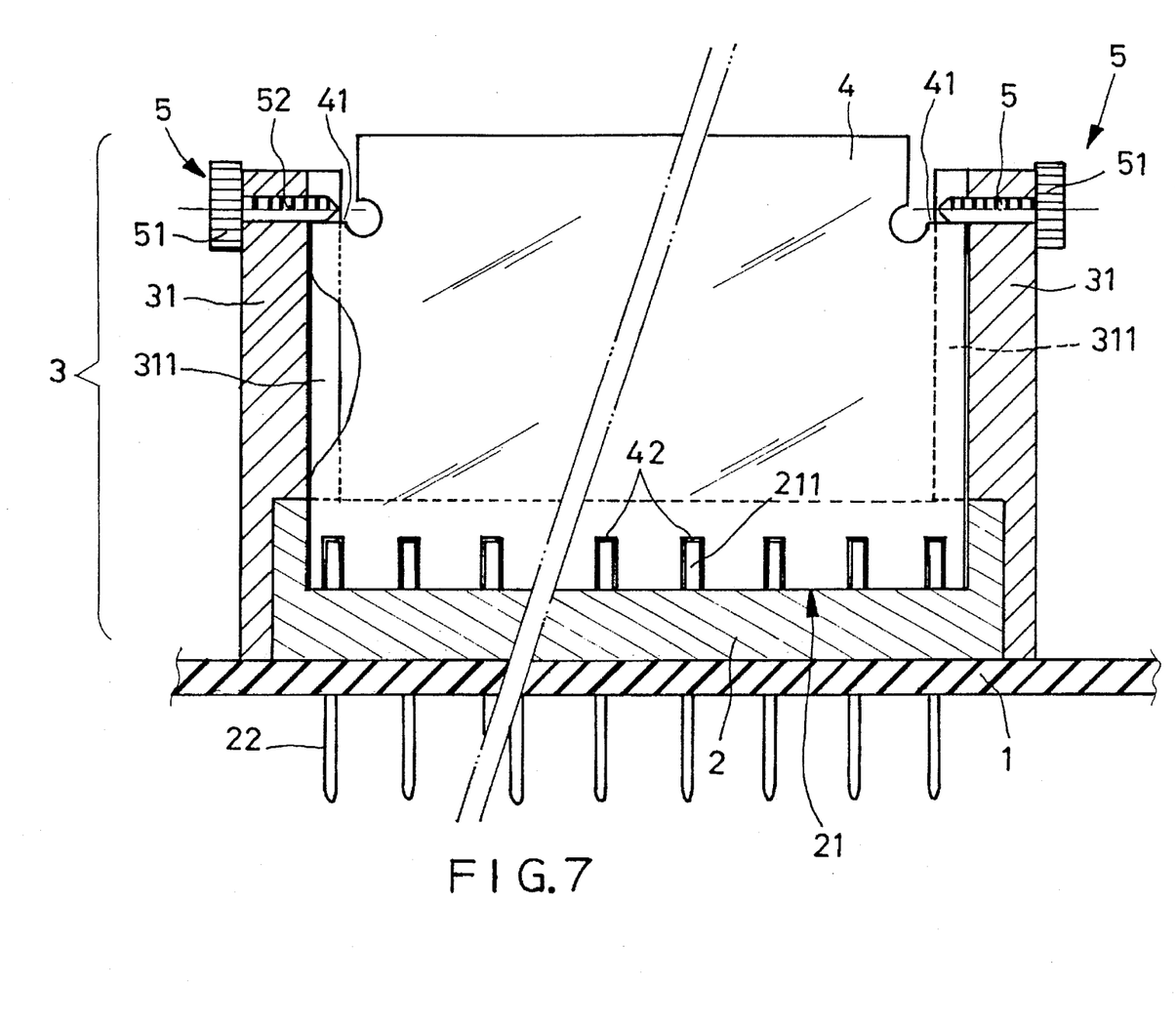
FIG. 7 is a sectional view of another alternate form of the present invention, showing the holding down devices horizontally fastened to the vertical sections of the mounting frame and forced into engagement with the edge notches of the CPU card.

FIG. 7 is a sectional view of another alternate form of the present invention, in which the screw bodies 52 of the holding down devices (screw bolts) 5 are respectively fastened to the vertical sections 31 of the U-shaped mounting frame 3 in a horizontal position and forced into engagement with the edge notches 41 of the CPU card 4, and the heads 51 of the holding down devices 5 are respectively stopped outside the vertical sections 31 of the U-shaped mounting frame 3.

Figure 8:
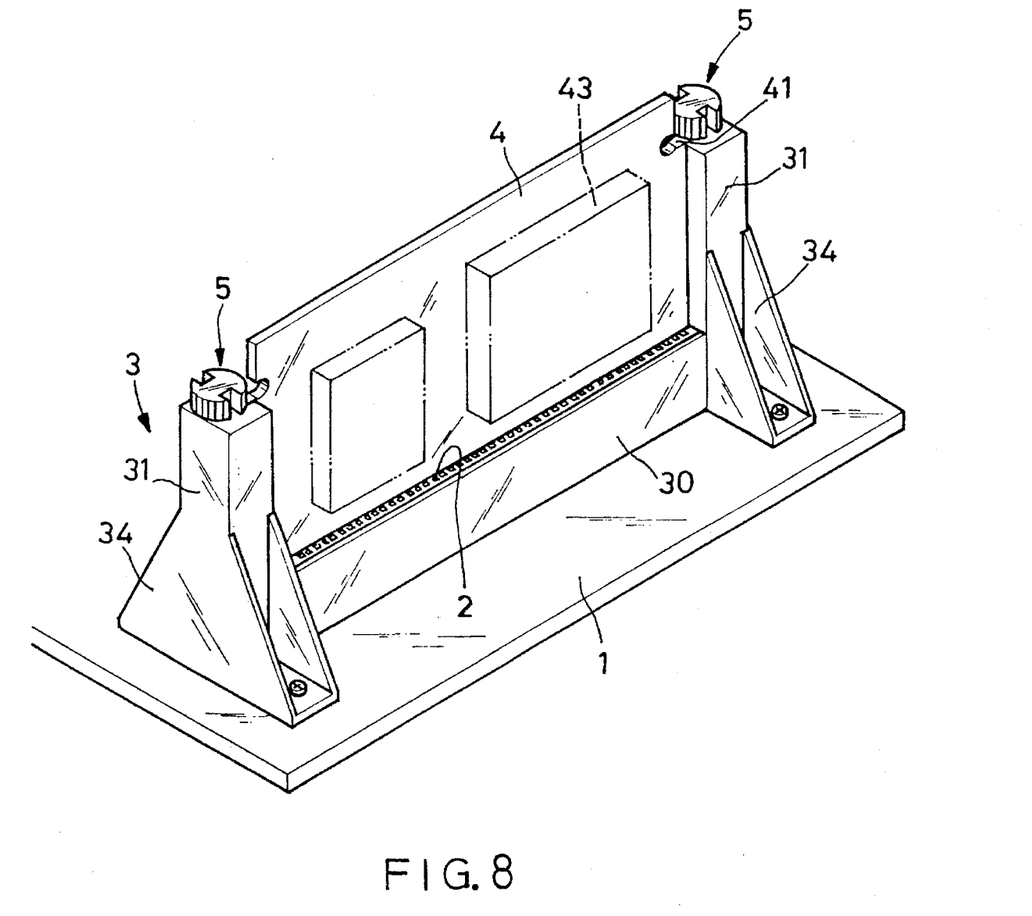
FIG. 8 is an elevational view of still another alternate form of the present invention.
Figure 9:
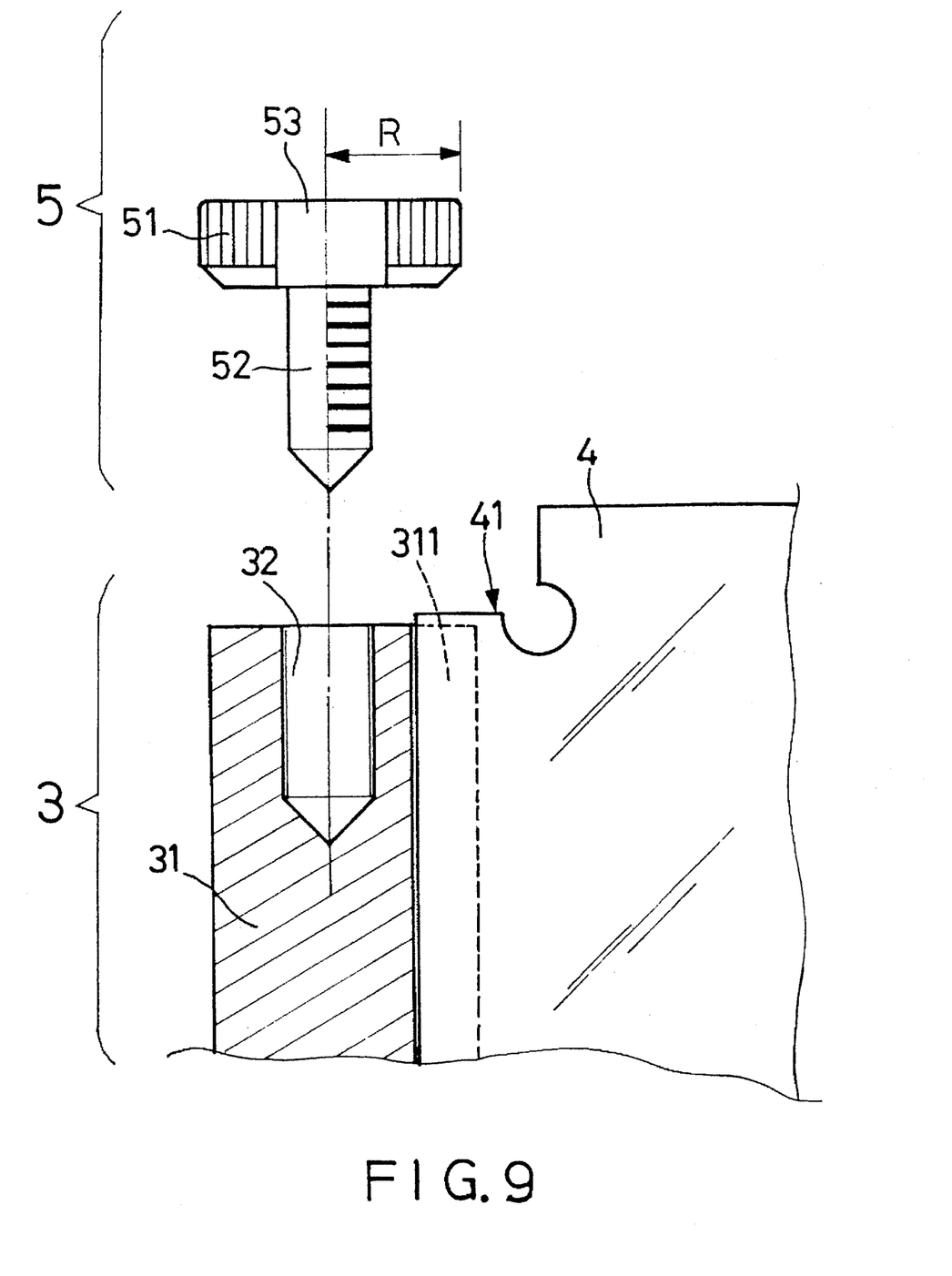
FIG. 9 is a sectional view of a part of the present invention, showing the structure of the holding down device and the relationship between the holding down device, the vertical section of the U-shaped mounting frame, and the CPU card.

FIG. 8 shows still another alternate form of the present invention, in which the U-shaped mounting frame 3 comprises a plurality of reinforcing ribs 34 bilaterally outwardly raised from the vertical sections 31 for stably supporting the U-shaped mounting frame 3 on the mother board 1.

Figure 10:
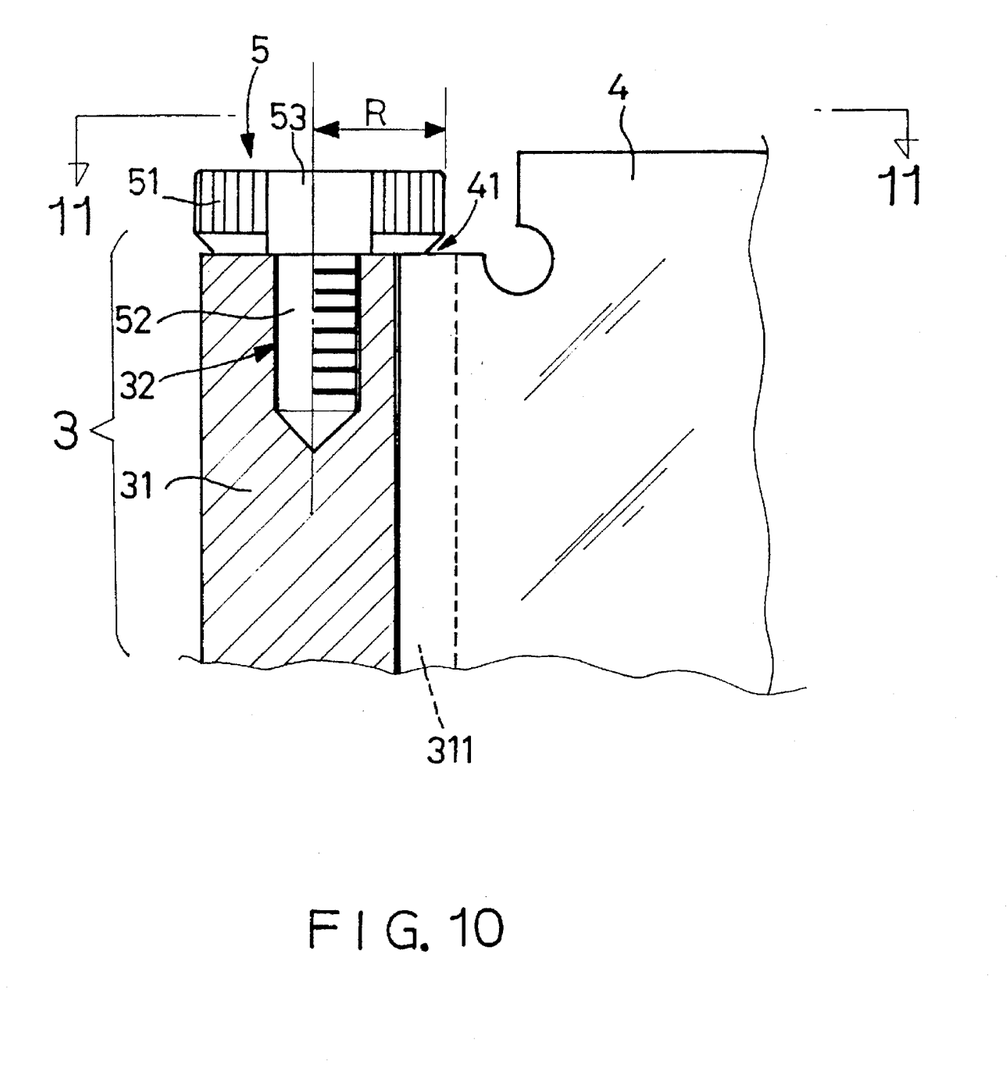
FIG. 10 is similar to FIG. 9 but showing the holding down device fastened to the vertical section of the U-shaped mounting frame and forced into engagement with the corresponding edge notch of the CPU card.
Figure 11:
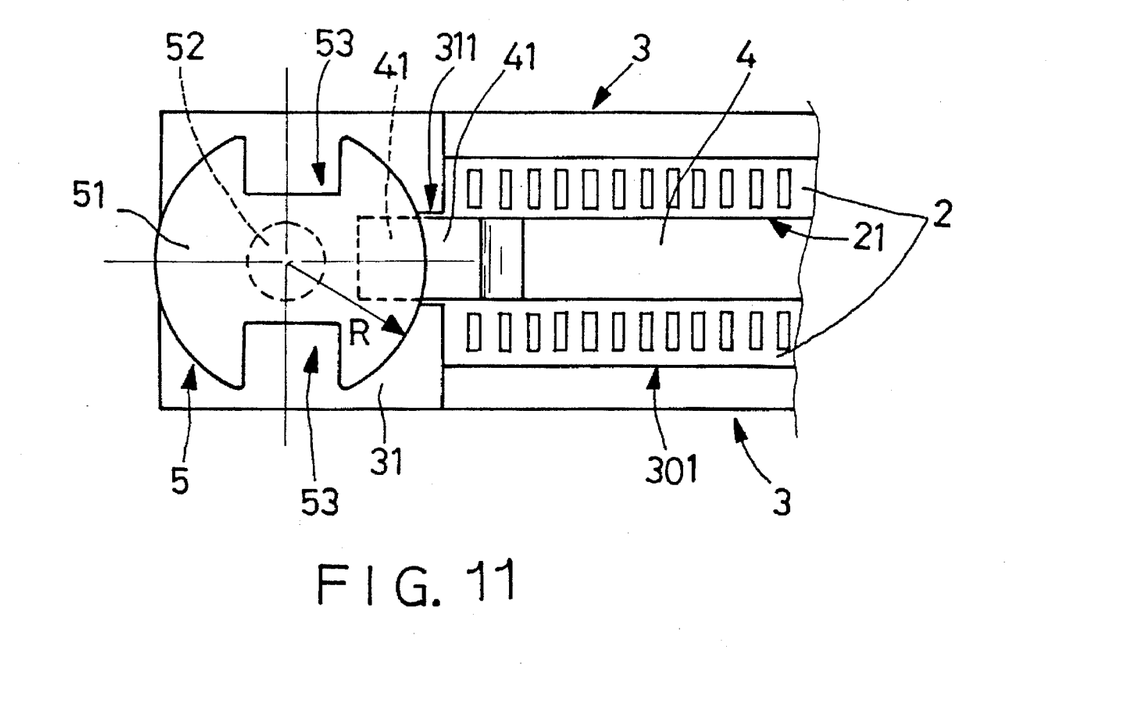
FIG. 11 is a top view taken along line 11—11 of FIG. 10.
Figure 12:
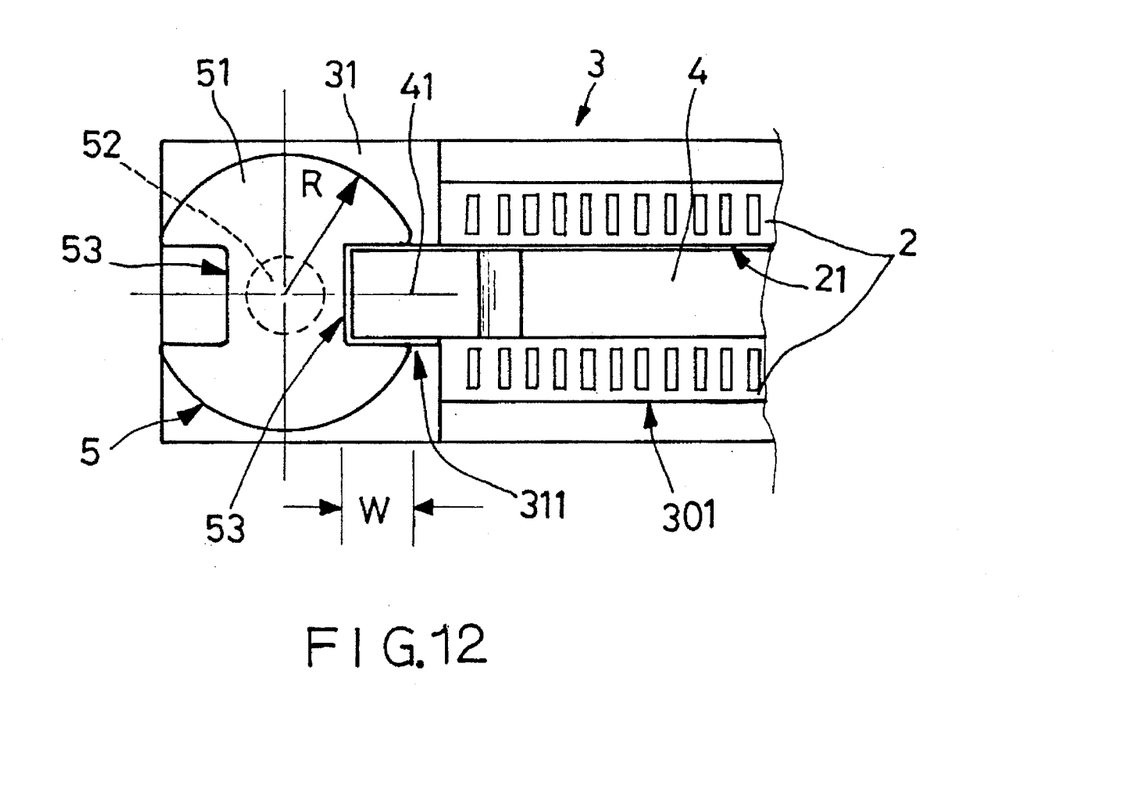
FIG. 12 is similar to FIG. 11 but showing one edge notch of the head of the holding down device moved into alignment with the longitudinal sliding groove of the corresponding vertical section of the U-shaped mounting frame.

Referring to Figures from 9 to 12, the head 51 of the holding down device 5 has a radius R longer than the distance between the axial center of the top screw hole 32 and one lateral side of the CPU card 4, and at least one edge notch 53. The depth W of the edge notch 53 is slightly longer or approximately equal to the depth of the longitudinal sliding groove 311. Through the head 51, the screw body 52 of the holding down device 5 can be easily threaded into the top screw hole 32 of one vertical section 31 of the U-shaped mounting frame 3 by hand. When the holding down device 5 is installed, the head 51 is forced into engagement with one edge notch 41 of the CPU card 4, and therefore the CPU card 4 is held down by the head 51 of the holding down device 5 (see FIG. 10). FIG. 11 is a top view taken along line 11—11 of FIG. 10, in which the edge notches 53 are moved away from the longitudinal sliding groove 311 of the corresponding vertical section 31 of the U-shaped mounting frame 3, and the solid part of the head 51 of the holding down device 5 is stopped above the corresponding edge notch 41 to hold down the CPU card 4. When one edge notch 53 of the head 51 of each holding down device 5 is respectively moved into alignment with the longitudinal sliding groove 311 of each vertical section 31 of the U-shaped mounting frame 3, the CPU card 4 is allowed to be pulled out of the longitudinal sliding grooves 311 of the vertical sections 31 of the U-shaped mounting frame 3 (see FIG. 12). When a new CPU card is installed, the holding down devices 5 are turned into engagement with the edge notches of the newly installed CPU card to hold it down.

Figure 13:
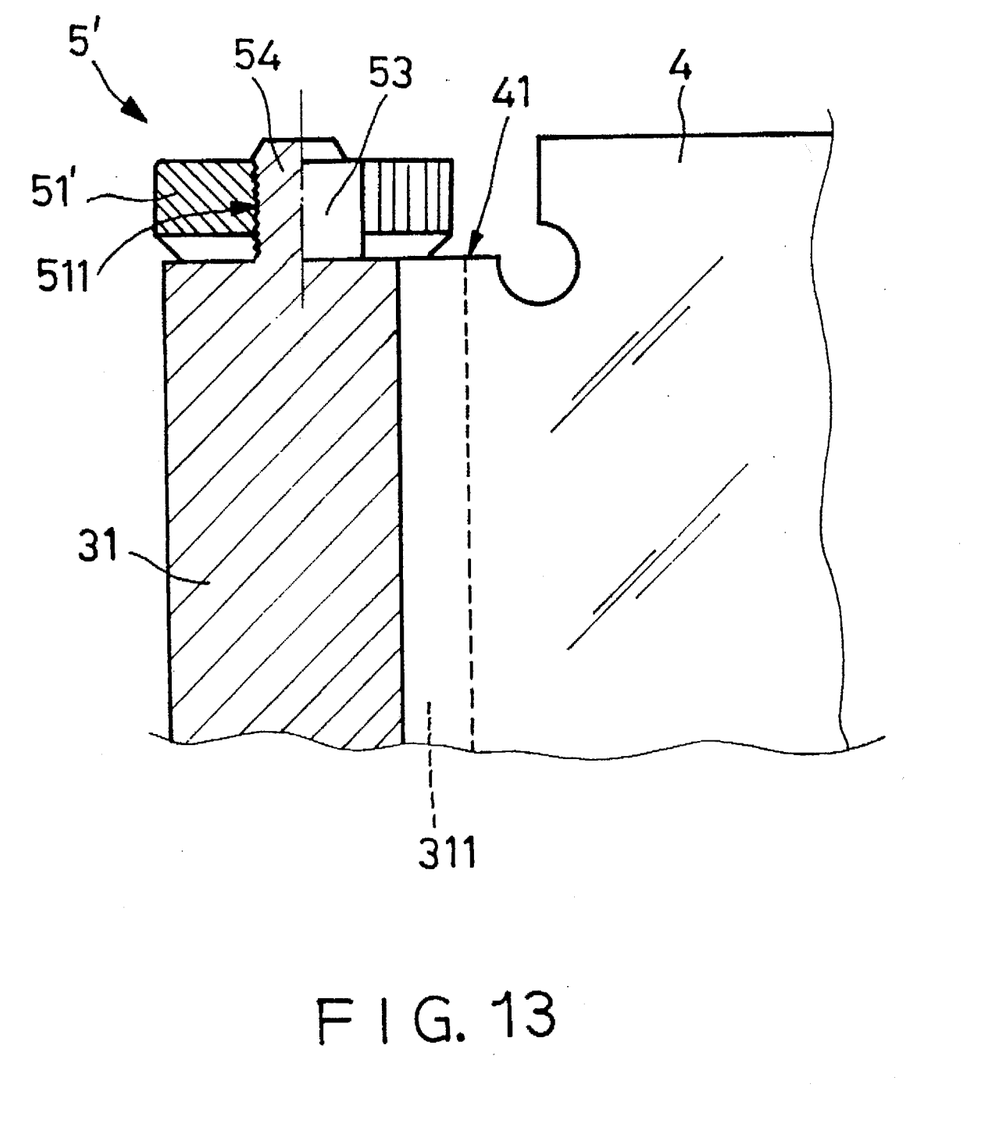
FIG. 13 is a sectional view of a part of the present invention, showing an alternate form of the holding down device.

FIG. 13 shows a yet further alternate form of the present invention, in which the holding down device 5' is a nut 51' having an center screw hole 511 directly threaded onto an upright screw rod 54 at the top of the vertical section 31, and at least one edge notch 53 for the passing of the CPU card 4.

Figure 14:
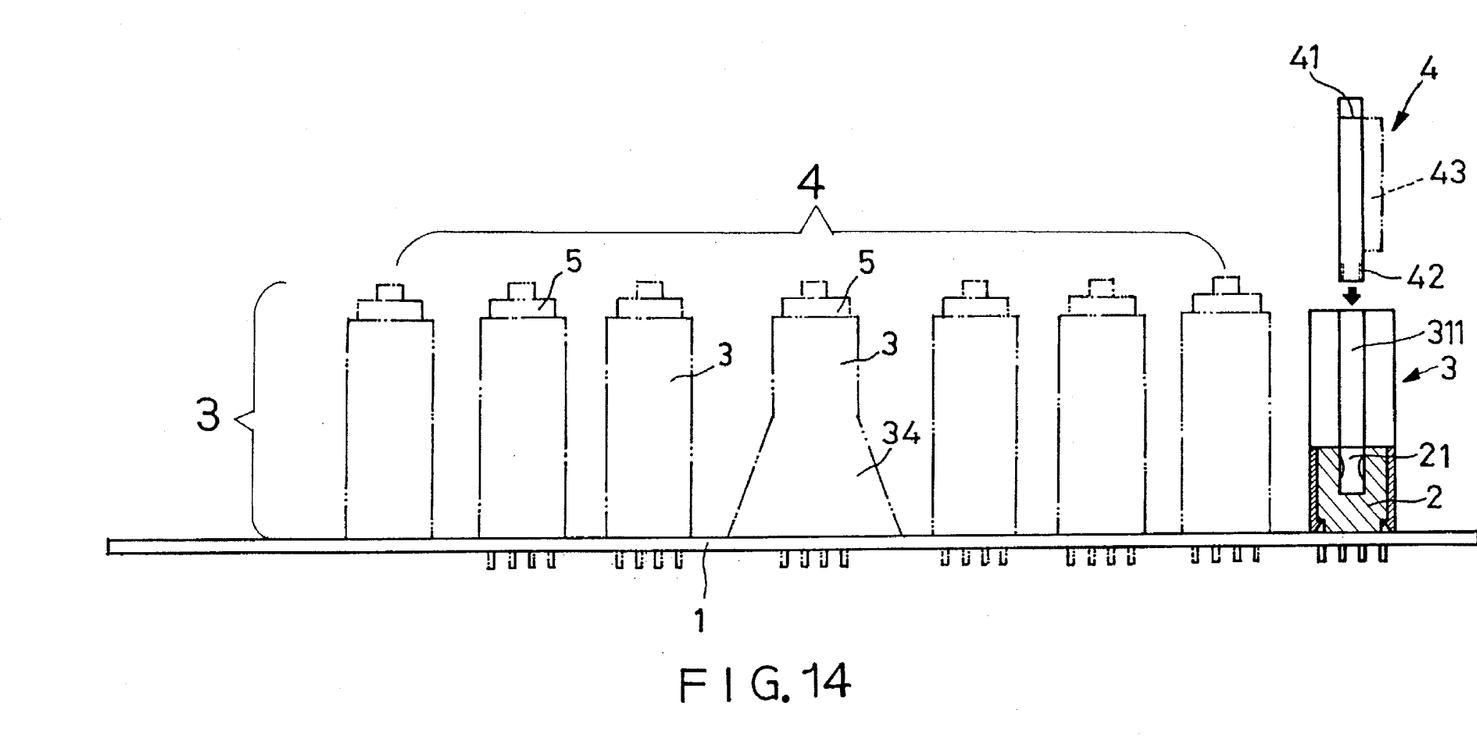
FIG. 14 shows an application example of the present invention.

Referring to FIG. 14, the mother board 1 may be designed for the installation of a plurality of electrical connectors 2, so that a plurality of CPU cards 4 can be respectively installed in the electrical connectors 2 and secured in place by a respective U-shaped mounting frame 4 and a respective set of holding down devices 5.

It is to be understood that the drawings are designed for purposes of illustration only, and are not intended as a definition of the limits and scope of the invention disclosed.

What the invention claimed is:

1. A CPU card mounting structure comprising an electrical connector installed in a mother board and comprising a card slot, a substantially U-shaped mounting frame mounted on said electrical connector, a CPU card mounted in said U-shaped mounting frame and inserted into the card slot of said electrical connector to be electrically connected to said mother board, and two holding down devices respectively fastened to said U-shaped mounting frame at two opposite sides to hold down said CPU card, wherein:

said U-shaped mounting frame comprises a horizontal section, and two vertical sections respectively upwardly raised from two opposite ends of said horizontal section at right angles, said horizontal section comprising a connector slot adapted for receiving said electrical connector, and coupling means adapted for coupling to respective coupling means of said electrical connector, each of said vertical sections comprising a longitudinal sliding groove at an inner side, the longitudinal sliding grooves of said vertical sections being respectively connected to two opposite ends of the card slot of said electrical connector at right angles;

said electrical connector comprises coupling means disposed inside the card slot thereof, and adapted for coupling to the coupling means of said U-shaped mounting frame;

said CPU card is inserted through the longitudinal sliding grooves of the vertical sections of said U-shaped mounting frame into the card slot of said electrical connector, and held down in the card slot of said electrical connector in a vertical position by said holding down devices;

said holding down devices are respectively fastened to the vertical sections of said U-shaped mounting frame to hold down said CPU card in said electrical connector.

2. The CPU card mounting structure of claim 1 wherein said U-shaped mounting frame comprises a plurality of reinforcing ribs respectively and outwardly raised from lateral sides of said vertical sections.

3. The CPU card mounting structure of claim 1 wherein each of the vertical sections of said U-shaped mounting frame comprises a top screw hole; each of said holding down devices comprises a screw body threaded into the top screw hole of one vertical section of said U-shaped mounting frame, and a head disposed at one end of the screw body and stopped above the corresponding vertical section of said U-shaped mounting frame, said head having a radius forced into engagement with a top edge notch at one lateral side of said CPU card to hold down said CPU card, and at least one opening, said CPU card being allowed to be inserted into or moved out of the longitudinal sliding grooves of the vertical sections of said U-shaped mounting frame when said holding down devices are respectively turned in the top screw holes of the vertical sections of said U-shaped mounting frame to move one opening of the head of each holding down devices into alignment with the longitudinal sliding grooves of the vertical sections of said U-shaped mounting frame.

4. the CPU card mounting structure of claim 1 wherein each of the vertical sections of said U-shaped mounting frame comprises an upright screw rod at the top; each of said holding down devices comprises a nut threaded onto the upright screw rod of one vertical section of said U-shaped mounting frame, said nut having at least one solid peripheral portion forced into engagement with one top edge notch at one lateral side of said CPU card to hold down said CPU card in the card slot of said electrical connector, and at least one opening, said CPU card being allowed to be inserted into or moved out of the longitudinal sliding grooves of the vertical sections of said U-shaped mounting frame when said holding down devices are respectively turned on the upright screw rods of the vertical sections of said U-shaped mounting frame to move one opening of the nut of each holding down device into alignment with the longitudinal sliding grooves of the vertical sections of said U-shaped mounting frame.

5. The CPU card mounting structure of claim 3 wherein the opening of the head of each of said holding down devices is an edge notch.

6. The CPU card mounting structure of claim 4 wherein the opening of the nut of each of said holding down devices is an edge notch.

* * * * *